United States Patent [19]

Kimura et al.

[11] Patent Number: 5,142,254
[45] Date of Patent: Aug. 25, 1992

[54] ULTRASONIC DELAY LINE DEVICE WITH AN ADJUSTING CIRCUIT FOR ADJUSTING DELAY TIME, A COMB-SHAPED FILTER USING THE ULTRASONIC DELAY LINE DEVICE AND A METHOD OF ADJUSTING DELAY TIME

[75] Inventors: Etsuji Kimura, Kamakura; Naomitsu Umemura; Masahiko Maeda, both of Funabashi, all of Japan

[73] Assignee: Asahi Glass Company Ltd., Tokyo, Japan

[21] Appl. No.: 575,570

[22] Filed: Aug. 31, 1990

[30] Foreign Application Priority Data

Sep. 8, 1989 [JP] Japan .................................. 1-104870

[51] Int. Cl.⁵ .............................................. H03H 9/38
[52] U.S. Cl. .................................... 333/144; 333/147; 333/186
[58] Field of Search ............... 333/141, 142, 144, 147, 333/149, 186, 188

[56] References Cited

U.S. PATENT DOCUMENTS

| | | | |
|---|---|---|---|
| 3,286,205 | 11/1966 | Ballato | 333/144 |
| 3,581,247 | 5/1971 | Belford et al. | 333/142 |
| 3,939,442 | 2/1976 | Ogita | 333/188 |
| 4,492,928 | 1/1985 | Hayakawa et al. | 333/142 X |
| 4,734,662 | 3/1988 | Izumida et al. | 333/141 X |

FOREIGN PATENT DOCUMENTS 63-64118 4/1988 Japan .

*Primary Examiner*—Eugene R. LaRoche
*Assistant Examiner*—Benny Lee
*Attorney, Agent, or Firm*—Oblon, Spivak, McClelland, Maier & Neustadt

[57] ABSTRACT

An ultrasonic delay line device has an adjusting circuit for adjusting delay time provided between two terminals at the power input side of an ultrasonic delay line, wherein the adjusting circuit includes a serial connection of a fixed capacitor and a variable resistor connected between said two terminals of the power input side and a fixed coil connected in parallel with the serial connection of the fixed capacitor and the variable resistor.

8 Claims, 9 Drawing Sheets

STEP 1 — ADJUST LENGTH OF DELAY MEDIUM BY GRINDING END OF MEDIUM

STEP 2 — ADJUST ADJUSTING CIRCUIT

ULTRASONIC DELAY LINE DEVICE WITH AN ADJUSTING CIRCUIT FOR ADJUSTING DELAY TIME, A COMB-SHAPED FILTER USING THE ULTRASONIC DELAY LINE DEVICE AND A METHOD OF ADJUSTING DELAY TIME

BACKGROUND OF THE INVENTION

1. Field of the Invention

The present invention relates to an adjusting circuit for an ultrasonic delay line and an ultrasonic delay line device containing such an adjusting circuit.

2. Discussion of Background

FIGS. 8 and 9 show respectively adjusting circuits for delay time adjustment in a conventional ultrasonic delay line. In the embodiments as shown in FIGS. 8 and 9, fixed resistors R1, R2, fixed coils L1, L2 and variable coils T1, T2 are used for a matching circuit in a circuit formed between input terminals 1, 1' and output terminals 2, 2' for an ultrasonic delay line DL. Adjustment of delay time is conducted by changing the inductances of the variable coils T1, T2. There is also known a circuit as shown in FIG. 10 which is disclosed in Japanese Utility Model Publication No. 64118/1988 as another conventional example. FIG. 10 shows a delay line DL formed between input terminals 1, 1' and output terminals 2, 2', having a input circuit formed by a resistor R1 disposed between input terminal 1 and a series connection of a parallel-connected coil L1 and capacitor and C1 with a variable resistor Vr, and having an output circuit consisting of the parallel connection of on a coil L2 and a resistor R2. The circuit consisting of resistors R1 and R2 and a fixed coil L2 is used for impedance matching between an outer circuit and an ultrasonic delay line. The delay time of the ultrasonic delay line is adjusted by adjusting the semi-fixed resistor VR.

A change of the resistance value of the semi-fixed resistor VR causes a change of the quantity of a signal which is fed to the input terminals through the fixed coil L1 and the fixed capacitor C1 so that it influences the delay time of the circuit of the fixed coil L1 and the fixed capacitor C1.

The variable length of the delay time is primarily determined by the values of the fixed coil L1 and the fixed capacitor C1. Namely, the impedance value of the parallel circuit of the fixed coil L1 and the fixed capacitor C1 becomes substantially infinite, causing a parallel resonance, in the vicinity of $\omega L1 - 1/(\omega C1) = 0$ (where $\omega = 2\pi f$, f being the central frequency of the ultrasonic delay line, i.e. 3.579545 MHz, L1 = 6.8 $\mu$H, and C1 = 270 pF). At this point, the variable length of the delay time becomes substantially zero, whereby adjustment of the delay time becomes impossible (FIG. 3).

Thus, in the determination of the values of the fixed coil L1 and the fixed capacitor C1, it is necessary to avoid the disadvantage caused by the above-mentioned combination, which is a problem in designing a delay line. A more detailed description of the operation of the circuit shown in FIG. 10 is provided in Publication No. 64118/1988.

The conventional delay lines using such adjusting circuits had problems that there was a restriction in designing a circuit, in particular, in designing a pattern of printed wiring on a substrate since the size of a variable coil was large in comparison with other circuit elements such as a fixed coil, a fixed resistor, a fixed capacitor, a trimmer potentiometer and so on, the variable coil had a larger number of terminals, had a large height, was expensive and took much time because of custom-made production.

In the circuit of a conventional type as shown in FIG. 10, there was a problem that a delay time width to be changed was small, especially, the changeable delay time width was nearly zero depending on selection of the constants of a capacitor C1 and a fixed coil L1. In this case, it was almost impossible to adjust the delay time even by adjusting a variable resistor Vr.

SUMMARY OF THE INVENTION

The present invention is to eliminate the above-mentioned problems and to provide an ultrasonic delay line device having an adjusting circuit for adjusting delay time provided between two terminals at the power input side of an ultrasonic delay line, wherein said adjusting circuit comprises a serial connection of a fixed capacitor and a variable resistor connected between said two terminals of the power input side and a fixed coil connected in parallel with the serial connection of the fixed capacitor and the variable resistor.

DETAILED DESCRIPTION OF THE PREFERRED EMBODIMENTS

Figure 1:
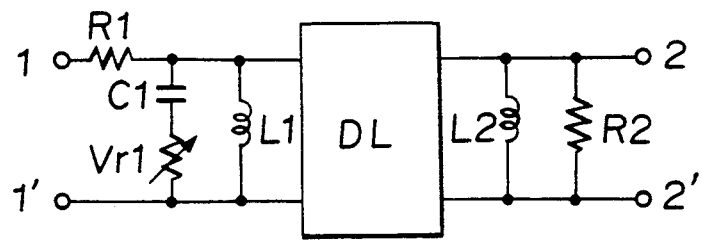
FIG. 1 is a circuit diagram of an embodiment of an ultrasonic delay line including an adjusting circuit according to the present invention.

Referring to the drawings wherein the same reference numerals and characters designate the same or corresponding parts, particularly in FIG. 1, there is shown an embodiment of the adjusting circuit for delay time adjustment in an ultrasonic delay line according to the present invention.

A fixed resistor R1 is connected in series between an ultrasonic delay line DL and an input terminal 1 thereof and a serial connection of a fixed capacitor C1 and a trimmer potentiometer Vr1 is connected between the output terminal of the fixed resistor R1 and an input terminal 1' for the ultrasonic delay line DL. Further, a fixed coil L1 is connected in parallel with the serial connection of the fixed capacitor C1 and the trimmer potentiometer Vr1 between the output terminal of the fixed resistor R1 and the input terminal 1'. Thus, an adjusting circuit is formed by the above-mentioned circuit elements and the arrangement of circuit. The trimmer potentiometer Vr1 is a very small-sized variable resistor whose resistance value is adjustable through a small, thin screw provided at a part thereof and which is useful for miniaturization of an ultrasonic delay line device.

Adjustment of delay time is conducted by changing the resistance of the trimmer potentiometer Vr1. In FIG. 1, the terminals 1, 1' constitute power input side terminals and terminals 2, 2' constitute power output side terminals.

Figure 13:
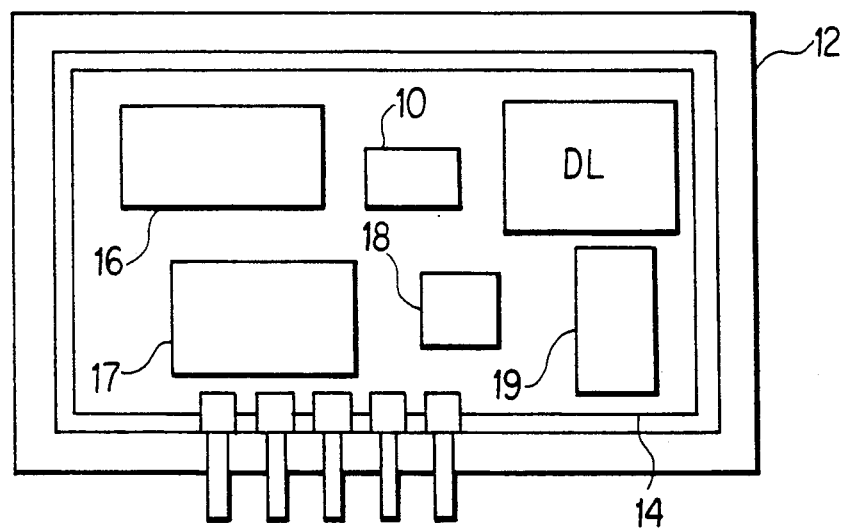
FIG. 13 is a diagram showing a package assembly of the ultrasonic delay line according to the invention.

As shown in FIG. 13, an (DL) ultrasonic delay line and the above-mentioned adjusting circuit 10 may be packaged in a single casing 12. The package may be assembled on a substrate 14 having other peripheral circuits 16-19. Thus, an ultrasonic delay line device capable of adjusting delay time can be provided.

EXAMPLE

FIGS. 1 through 7 show several examples of the present invention.

Figure 2:
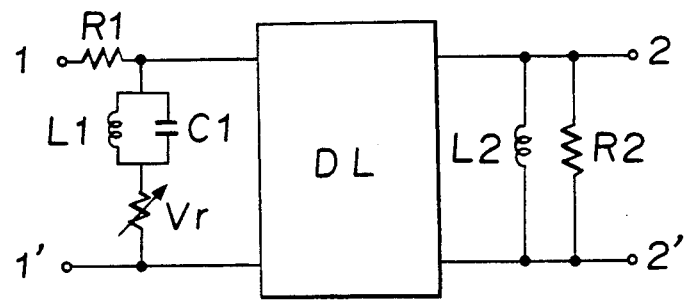
FIG. 2 is a circuit diagram of a conventional ultrasonic delay line.
Figure 3:
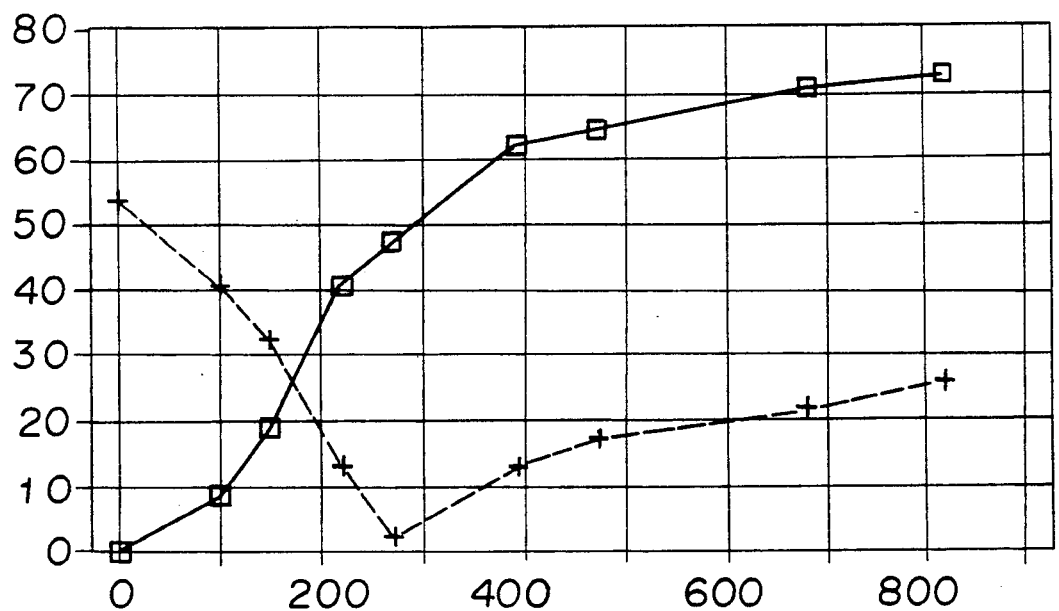
FIG. 3 is a graph obtained by measuring a relation of C1 value to changeable delay time width in the ultrasonic delay line of the present invention and a conventional ultrasonic delay line.

FIG. 1 is a circuit diagram of an ultrasonic delay line device which contains an embodiment of an adjusting circuit according to the present invention, and FIG. 2 is a circuit diagram of an ultrasonic delay line device which contains a conventional adjusting circuit. FIG. 3 is a graph in which characteristics of the ultrasonic delay line device of the present invention and the conventional device are compared, the results being obtained by measuring the changeable delay time width (ns) under conditions that the values of fixed capacitors C1 are optionally selected and the values of trimmer potentiometer Vr1 and variable resistor Vr are changed within a range of 0-1KΩ. The reactance of fixed coiled L1 is fixed to 6.8 μH.

In FIGS. 1 and 2, the resistors R1, R2 and the fixed coils L1, L2 are used for the matching of the impedance between an exterior circuit and the ultrasonic delay line. However, they may be removed.

Figure 10:
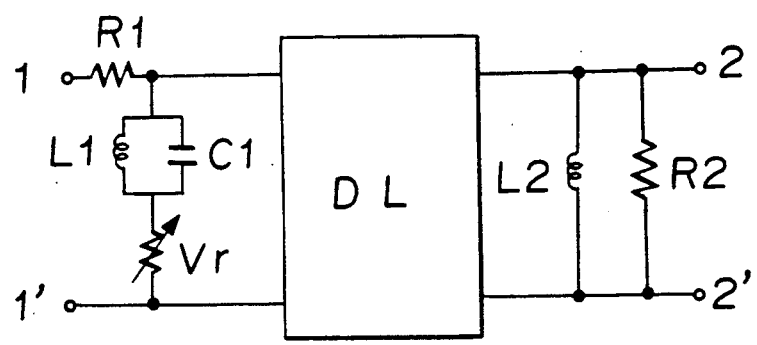

FIG. 2 has a similar structure to the circuit shown in FIG. 10 and operates similarly.

In FIG. 3, a line having marks □ represents the characteristics of the ultrasonic delay line of the present invention and a line having marks + represents the characteristics of the conventional ultrasonic delay line. Table 1 shows the numerical data. As shown in the graph and the numerical data, the ultrasonic delay line of the present invention permits adjustment of delay time in a broad range by the adjustment of the trimmer potentiometer Vr1 within a broad range of the capacitance of the capacitor C1. In particular, it has a changeable delay time width of about 1.5-4 times as large as that of the conventional ultrasonic delay line when the capacitance of the capacitor C1 is not less than 200 pF. In the conventional ultrasonic delay line, the changeable delay time width was nearly zero when the capacitance of the capacitor C1 was about 270 pF, and it was impossible to adjust the delay time.

TABLE 1

| Value of C1 (pF) | Changeable delay time width (ns) | |
|---|---|---|
| | Present invention | Conventional device |
| 0 | 0.0 | 53.6 |
| 100 | 8.6 | 40.7 |
| 150 | 19.3 | 32.1 |
| 220 | 40.7 | 12.0 |
| 270 | 47.1 | 2.1 |
| 390 | 62.1 | 12.9 |
| 470 | 64.3 | 17.1 |
| 680 | 70.7 | 21.4 |
| 820 | 72.9 | 25.7 |

Figure 4:
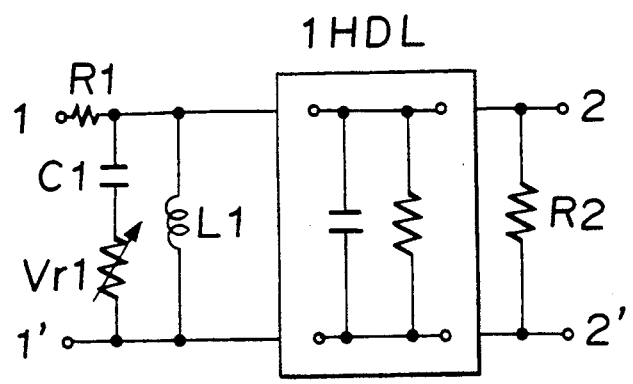
FIG. 4 is an equivalent circuit diagram of an embodiment of the ultrasonic delay line of the present invention.
Figure 5:
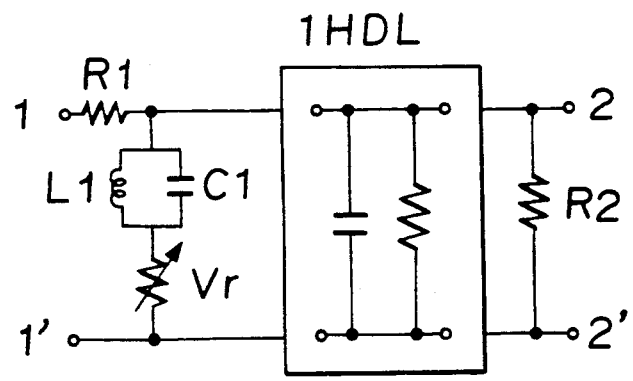
FIG. 5 is an equivalent circuit diagram of a conventional ultrasonic delay line.
Figure 6A:
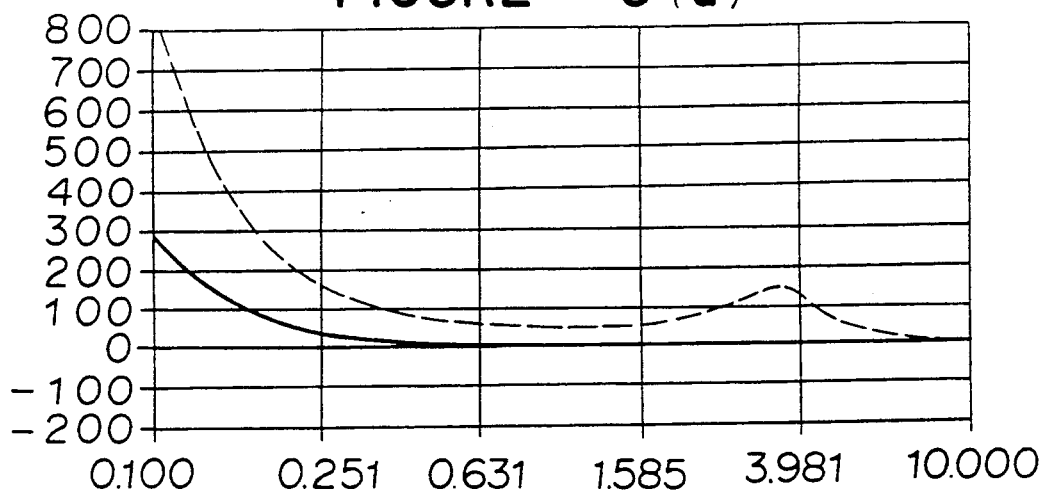
FIGS. 6a through 6f are respectively graphs showing results obtained by the calculation of the ultrasonic delay line of the present invention.
Figure 6B:
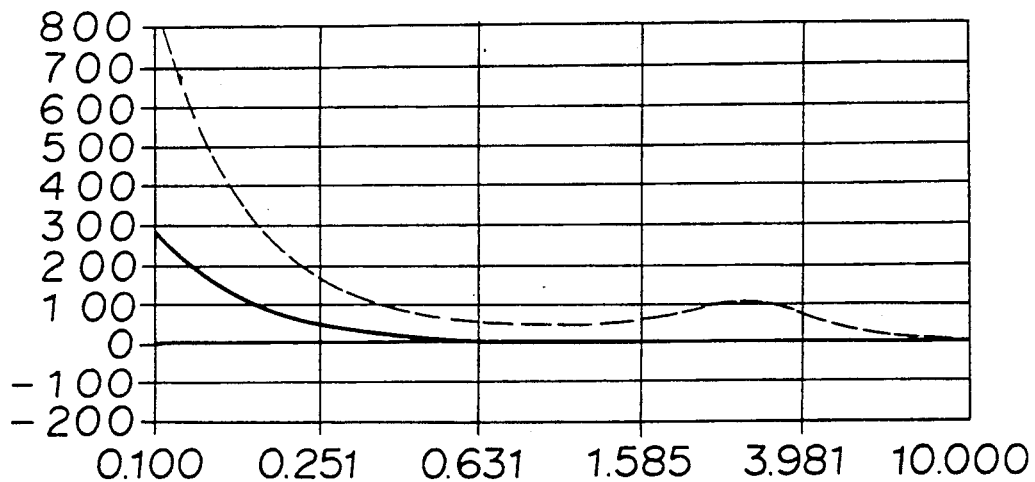
Figure 6C:
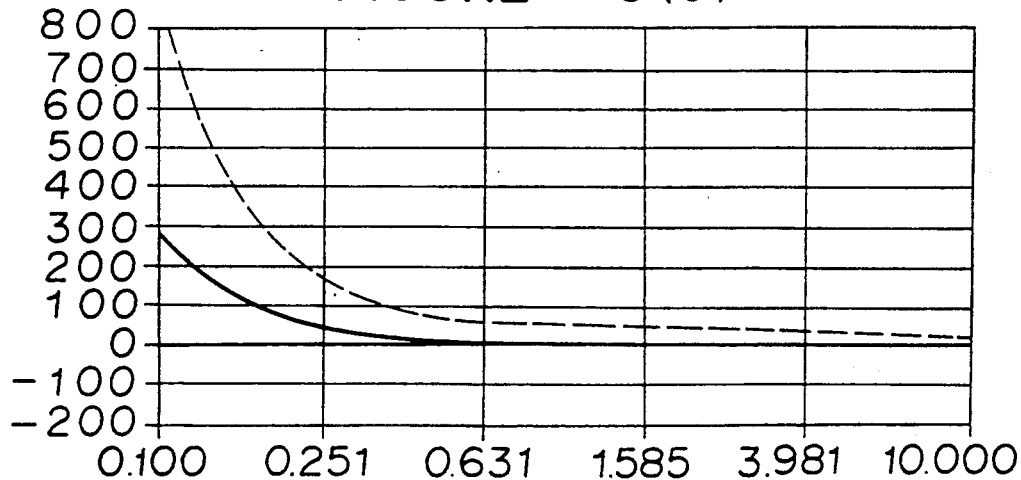
Figure 6:
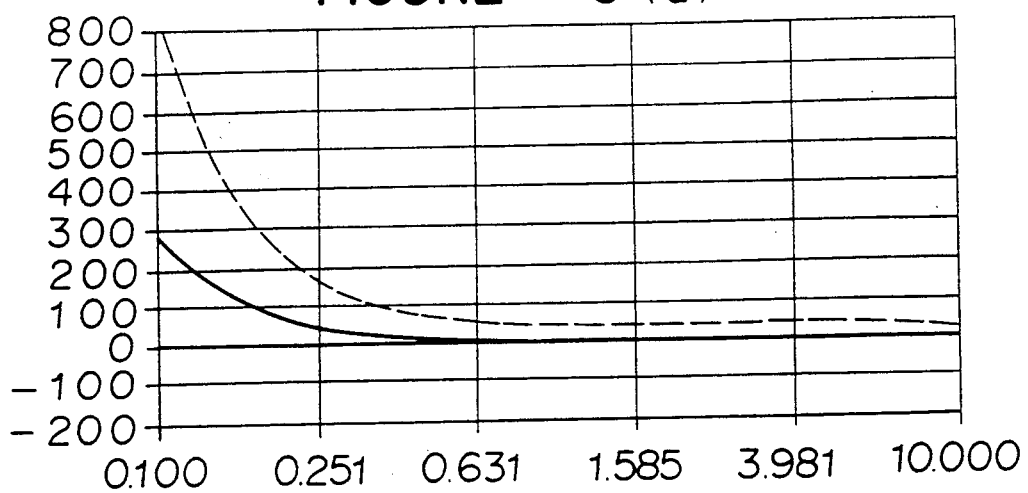
Figure 6:
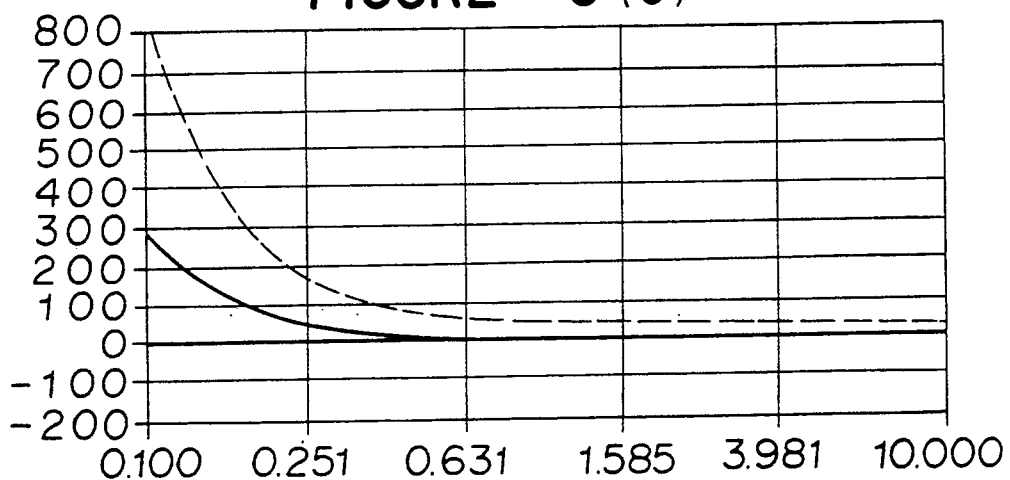
Figure 6:
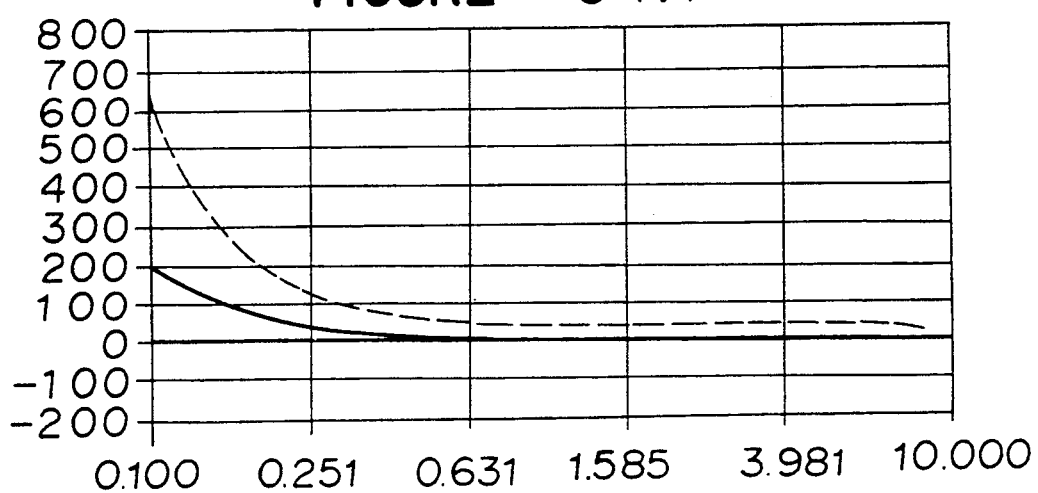
Figure 7A:
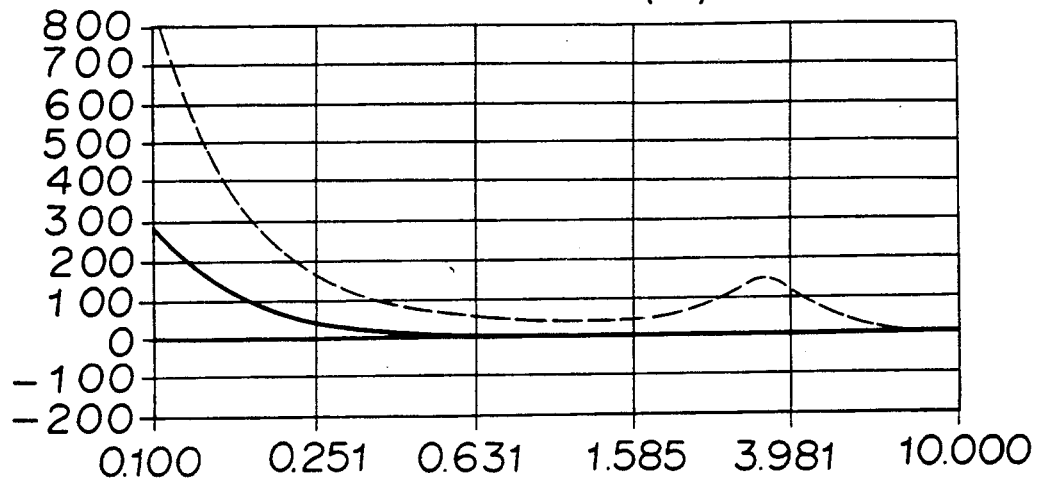
FIGS. 7a through 7f are respectively graphs showing results obtained by the calculation of a conventional ultrasonic delay line.
Figure 7B:
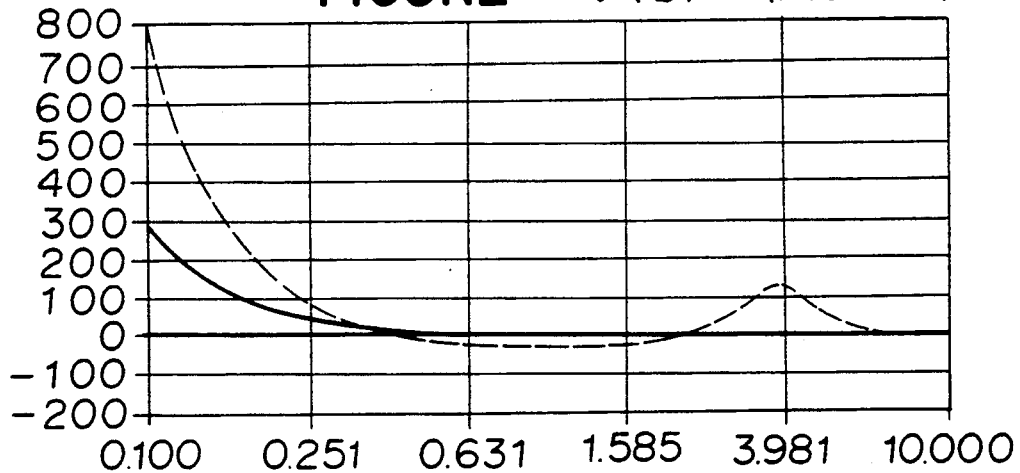
Figure 7C:
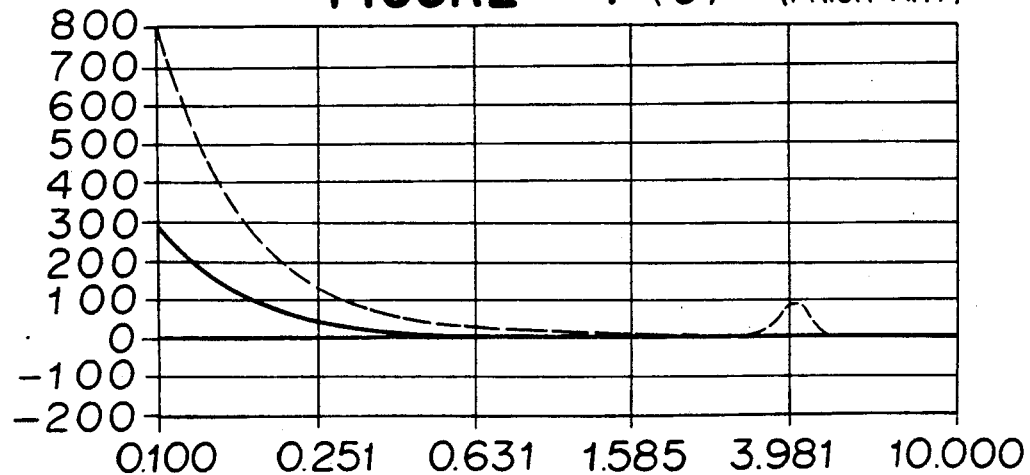
Figure 7D:
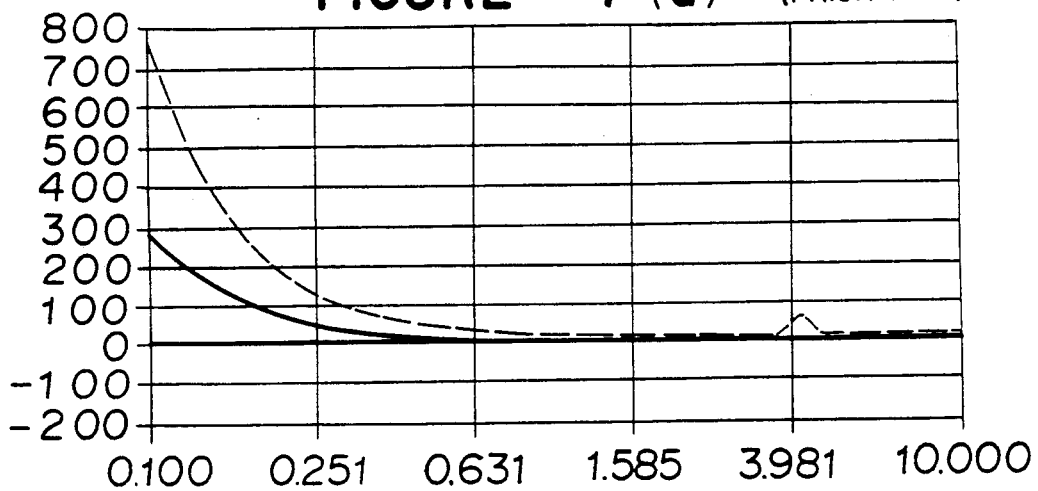
Figure 7E:
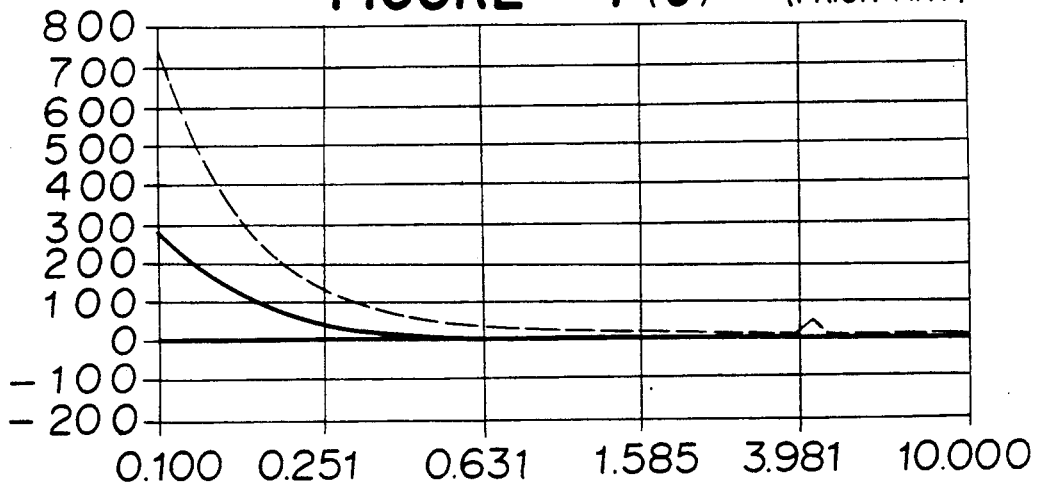
Figure 7F:
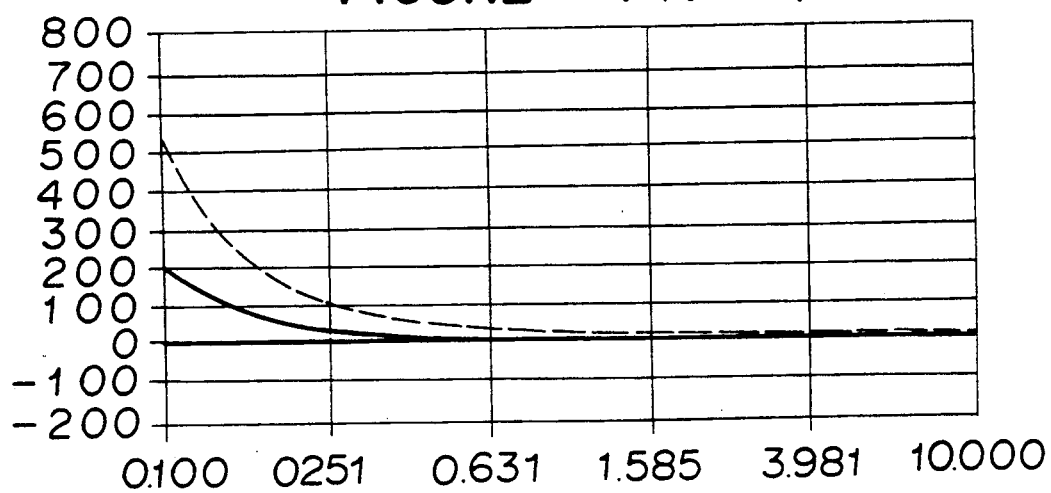
Figure 8:
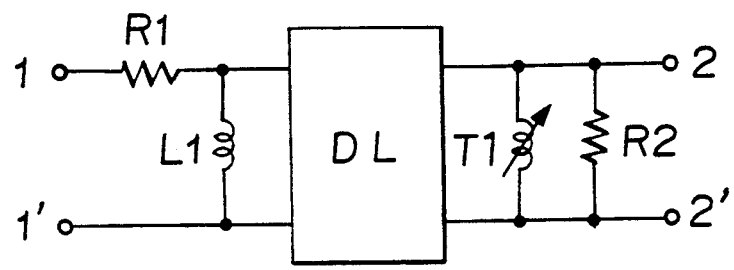
FIGS. 8 through 10 are respectively circuit diagrams of conventional ultrasonic delay lines.
Figure 9:
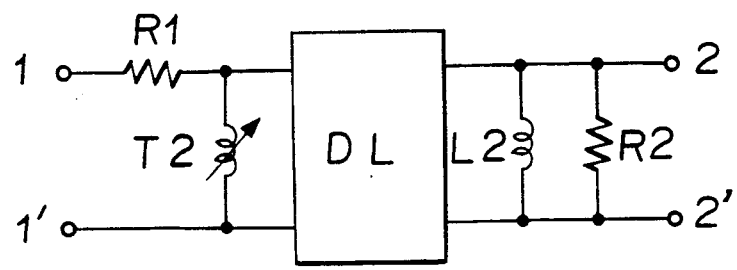

FIG. 4 is a diagram showing the equivalent circuit of the adjusting circuit of the present invention and an ultrasonic delay line and FIG. 5 is a diagram of the equivalent circuit of the conventional device. The circuits shown in FIGS. 4 and 5 are similar in construction to those of FIGS. 1 and 2, respectively, except that inductor L2 has been omitted and the delay line, 1HDL, is shown as a parallel connection of a resistor and capacitor.

FIGS. 6a-6f and 7a-7f are respectively graphs for comparing the characteristics of the ultrasonic delay line of the present invention and the conventional ultrasonic delay line wherein the frequency characteristics of group delay time $\Delta\theta/\Delta\omega$ is calculated by changing Vr1 and Vr values, wherein $\theta$ is a phase angle, $\omega$ is an angular frequency.

FIGS. 6a through 6f show results by the calculation of the ultrasonic delay line device of the present invention and FIGS. 7a through 7f show results by the calculation of the conventional device. FIGS. 6a through 6f and FIGS. 7a through 7f respectively correspond to cases that Vr1 and Vr are respectively short-circuited 100Ω, 500Ω, 1KΩ, 2KΩ, or infinity ($\infty$). In FIGS. 4 and 5, C1=220 pF and L1=6.8 μH.

In FIGS. 6a through 6f, there is no substantial change in the group delay line in a range higher than 0.631 MHz when the resistance of Vr1 is 500Ω or higher. On the other hand, in FIGS. 7a through 7f, there is a great change in the group delay time by the frequency except a case of Vr=$\infty$. Accordingly, it is difficult to adjust the delay time.

In the conventional ultrasonic delay line device as shown in FIG. 5, the changeable delay time width is large in a range of C1=0-170 pF as seen in FIG. 3, however, the frequency characteristics of the group delay time are poor as seen in FIG. 7. Accordingly, it is understood that use of the conventional ultrasonic delay line device is not practical.

Figure 11:
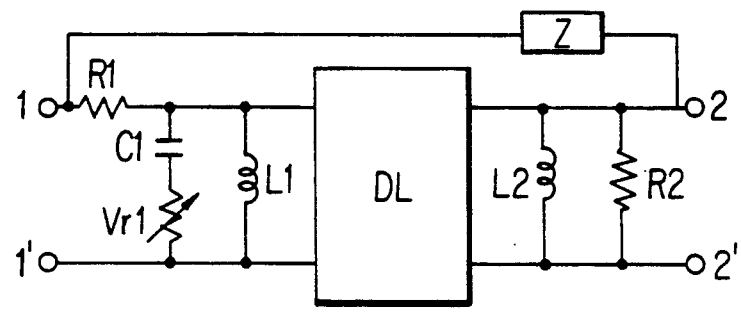
FIG. 11 is an equivalent circuit diagram of the ultrasonic delay according to the invention used to produce a comb filter characteristic.

The ultrasonic delay line device of the present invention can be applied to a comb-shaped filter circuit, as shown in FIG. 11. In this case, comb-filter characteristics may be obtained by connecting an impedance element 2 such as a resistor, a capacitor, or the like between the terminals 1, 2 of the circuit shown in FIG. 1 so as to mix a delay signal and a non-delay signal through the impedance element.

Since the adjusting circuit of the present invention particularly facilitates adjustment of the delay time of the ultrasonic delay line device, productivity is improved.

Figure 12:
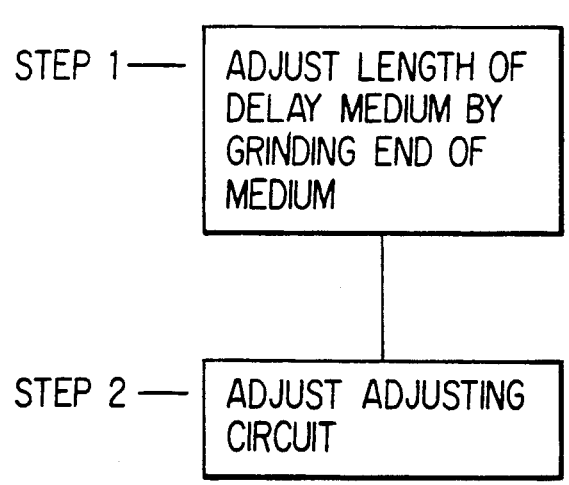
FIG. 12 is a flow diagram of a method according to the invention.

As a method of adjusting the delay time, as shown in FIG. 12, the distance of a path of an ultrasonic wave is adjusted by grinding an end surface of a delay medium made of a material such as glass (Step 1). By grinding an end surface of the delay medium, it is possible to adjust the delay time with an accuracy of +3-5 ns. Further, by adjusting the adjusting circuit, a predetermined delay time can be adjusted with an accuracy of +0-1 ns (Step 2). Grinding operation for adjustment with a high accuracy is no longer required since the changeable delay time width of the regulating circuit is wide and the frequency characteristics are smooth, hence, manufacturing time can be shortened and the yield can be improved, thus, productivity is improved.

In the conventional adjusting circuit for adjusting delay time by an ultrasonic delay line, a variable coil was used. On the other hand, in the present invention, adjustment of delay time can be obtained by connecting the above-mentioned circuit including a fixed capacitor, a fixed coil and a variable resistor between input terminals 1, 1'. With such arrangement, miniaturization of an ultrasonic delay line device can be realized, surface-mounting of the adjusting circuit can be easily attained, and the manufacturing cost of the device can be reduced.

In a case that the surface-mounting of the adjusting circuit including a variable coil in the conventional adjusting circuit, a changeable range in impedance was restricted since the size and the height of the variable coil have to be reduced. Thus, the conventional adjusting circuit had a serious drawback that an adjustable range of the delay time of the ultrasonic delay line was limited. Such drawback can be eliminated by the present invention.

Further, in the conventional adjusting circuit, there was a disadvantage that the core of the variable coil may be damaged at the time of adjusting the delay time of the ultrasonic delay line. The disadvantage can be eliminated by using a trimmer potentiometer.

For designing a pattern of wiring on a print-wiring substrate, use of the trimmer potentiometer provides easy formation of such a pattern of wiring in comparison with use of the variable coil. Accordingly, a time of designing a pattern of wiring can be shortened.

In a conventional ultrasonic delay line, a circuit unit such as a comb filter wherein peripheral circuits and their elements were incorporated on a print-wiring substrate on which the adjusting circuit was mounted was used, and such circuit unit was useful for video tape recorders, color-TVs, video tape recorders with cameras which required high density mounting. In accordance with the present invention, however, the dimension in the thickness direction of a print-wiring substrate on which circuit elements are mounted can be reduced to more than half, and further high density mounting becomes possible.

Obviously, numerous modifications and variations of the present invention are possible in light of the above teachings. It is therefore to be understood that within the scope of the appended claims, the invention may be practiced otherwise than as specifically described herein.

We claim:

1. An ultrasonic delay line device with a power input side and a power output side having an adjusting circuit for adjusting delay time provided between two terminals at the power input side of an ultrasonic delay line, wherein said adjusting circuit comprises a serial connection of a fixed capacitor and a variable resistor connected between said two terminals of the power input side and a fixed coil connected in parallel with the serial connection of the fixed capacitor and the variable resistor, adjustment of said variable resistor varying said delay time.

2. The ultrasonic delay line device according to claim 1, wherein at least a fixed coil is connected between two terminals at the power output side of said ultrasonic delay line.

3. The ultrasonic delay line device according to claim 1, wherein a fixed coil and a resistor are connected in parallel between two terminals at the power output side of said ultrasonic delay line.

4. The ultrasonic delay line device according to claim 1, wherein the capacitance of the fixed capacitor is in a range of 200 pF to 1000 pF.

5. The ultrasonic delay line device according to claim 1, wherein the resistance of the variable resistor is in a range of 500Ω to 5KΩ.

6. An ultrasonic delay line device with a power input side and a power output side having an adjusting circuit for adjusting delay time provided between two terminals at the power input side of an ultrasonic delay line, wherein said adjusting circuit comprises a serial connection of a fixed capacitor and a variable resistor connected between said two terminals of the power input side and a fixed coil connected in parallel with the serial connection of the fixed capacitor and the variable resistor, adjustment of said variable resistor varying said delay time, and a container receiving therein said adjusting circuit together with said ultrasonic delay line.

7. A comb-shaped filter circuit which comprises:
   a serial connection of a fixed capacitor and a variable resistor connected between first and second terminals at a power input side of an ultrasonic delay line,
   a fixed coil connected in parallel with the serial connection of the fixed capacitor and the variable resistor, and
   an impedance element connected between said first terminal and a third terminal at a power output side of said ultrasonic delay line, thereby obtaining a comb-filter characteristic of said filter circuit, said filter circuit being adjusted by varying said variable resistor.

8. A method of adjusting delay time of an ultrasonic delay line device which comprises:
   a first step of adjusting a path length of an ultrasonic wave propagating in a delay medium of an ultrasonic delay line by grinding an end surface of the delay medium so as to change a length of said delay medium to thereby adjust delay time, and
   a second step of adjusting a regulating circuit having a serial connection of a fixed capacitor and a variable resistor connected between two terminals at a power input side of the ultrasonic delay line and a fixed coil connected in parallel with the serial connection of the fixed capacitor and the variable resistor by varying said variable resistor so as to adjust the delay time.

* * * * *